United States Patent
Chang et al.

(10) Patent No.: US 9,608,113 B2
(45) Date of Patent: Mar. 28, 2017

(54) SEMICONDUCTOR DEVICE STRUCTURE

(71) Applicant: TAIWAN SEMICONDUCTOR MANUFACTURING CO., LTD., Hsinchu (TW)

(72) Inventors: Che-Cheng Chang, New Taipei (TW); Yi-Jen Chen, Hsinchu (TW); Yung-Jung Chang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/930,037

(22) Filed: Nov. 2, 2015

(65) Prior Publication Data
US 2016/0071976 A1    Mar. 10, 2016

Related U.S. Application Data

(62) Division of application No. 14/143,789, filed on Dec. 30, 2013, now Pat. No. 9,196,708.

(51) Int. Cl.
| | |
|---|---|
| *H01L 29/76* | (2006.01) |
| *H01L 29/78* | (2006.01) |
| *H01L 21/265* | (2006.01) |
| *H01L 29/66* | (2006.01) |
| *H01L 21/8234* | (2006.01) |
| *H01L 27/092* | (2006.01) |

(Continued)

(52) U.S. Cl.
CPC ........ *H01L 29/7848* (2013.01); *H01L 21/265* (2013.01); *H01L 21/823412* (2013.01); *H01L 21/823418* (2013.01); *H01L 27/0922* (2013.01); *H01L 29/0847* (2013.01); *H01L 29/42364* (2013.01); *H01L 29/6653* (2013.01); *H01L 29/6656* (2013.01); *H01L 29/6659* (2013.01); *H01L 29/66545* (2013.01); *H01L 29/66636* (2013.01); *H01L 29/7834* (2013.01); *H01L 21/2652* (2013.01); *H01L 29/165* (2013.01); *H01L 29/7843* (2013.01)

(58) Field of Classification Search
CPC ............... H01L 29/76; H01L 21/76837; H01L 29/7843; H01L 29/7833; H01L 29/6659
See application file for complete search history.

(56) References Cited

U.S. PATENT DOCUMENTS

| | | |
|---|---|---|
| 5,045,486 A | 9/1991 | Chittipeddi et al. |
| 6,033,975 A | 3/2000 | Kwok et al. |

(Continued)

FOREIGN PATENT DOCUMENTS

| | | |
|---|---|---|
| TW | 200847432 | 12/2008 |
| TW | 201005872 | 2/2010 |

*Primary Examiner* — Phuc Dang
(74) *Attorney, Agent, or Firm* — Birch, Stewart, Kolasch & Birch, LLP

(57) ABSTRACT

A semiconductor device structure is provided. The semiconductor device structure includes a semiconductor substrate and a gate stack over the semiconductor substrate. The semiconductor device structure also includes a sealing structure over a sidewall of the gate stack, and a width ratio of the sealing structure to the gate stack is in a range from about 0.05 to about 0.7. The semiconductor device structure further includes an etch stop layer over the semiconductor substrate, the gate stack, and the sealing structure. The etch stop layer is in contact with the sealing structure.

19 Claims, 5 Drawing Sheets

(51) Int. Cl.
   *H01L 29/08*   (2006.01)
   *H01L 29/423*  (2006.01)
   *H01L 29/165*  (2006.01)

(56) References Cited

U.S. PATENT DOCUMENTS

| | | | |
|---|---|---|---|
| 6,521,501 | B1 | 2/2003 | Erhardt et al. |
| 2007/0275530 | A1* | 11/2007 | Hung ............... H01L 29/6653 438/299 |
| 2010/0078687 | A1* | 4/2010 | Zhang ............ H01L 21/823807 257/255 |
| 2010/0148269 | A1* | 6/2010 | Yelehanka ........ H01L 21/76837 257/368 |
| 2011/0117679 | A1 | 5/2011 | Lee et al. |
| 2012/0225529 | A1 | 9/2012 | Chen et al. |
| 2013/0178031 | A1* | 7/2013 | Ramkumar ..... H01L 21/823412 438/287 |
| 2015/0102416 | A1* | 4/2015 | Yin ................. H01L 21/823842 257/369 |

* cited by examiner

SEMICONDUCTOR DEVICE STRUCTURE

CROSS REFERENCE

This Application is a Divisional Application of application Ser. No. 14/143,789, filed on Dec. 30, 2013, now U.S. Pat. No. 9,196,708, the entire content of which is hereby incorporated by reference.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since the feature sizes continue to decrease, fabrication processes continue to become more difficult to perform. Therefore, it is a challenge to form reliable semiconductor devices with smaller and smaller sizes.

BRIEF DESCRIPTION OF THE DRAWINGS

For a more complete understanding of the illustrative embodiments and the advantages thereof, reference is now made to the following descriptions taken in conjunction with the accompanying drawings.

DETAILED DESCRIPTION OF THE ILLUSTRATIVE EMBODIMENTS

The making and using of various embodiments of the disclosure are discussed in detail below. It should be appreciated, however, that the various embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

Some variations of the embodiments are described. Throughout the various views and illustrative embodiments, like reference numbers are used to designate like elements. Additional operations may be provided before, during, and after the method, and some of the operations described may be replaced or eliminated for other embodiments of the method.

Figure 1A:
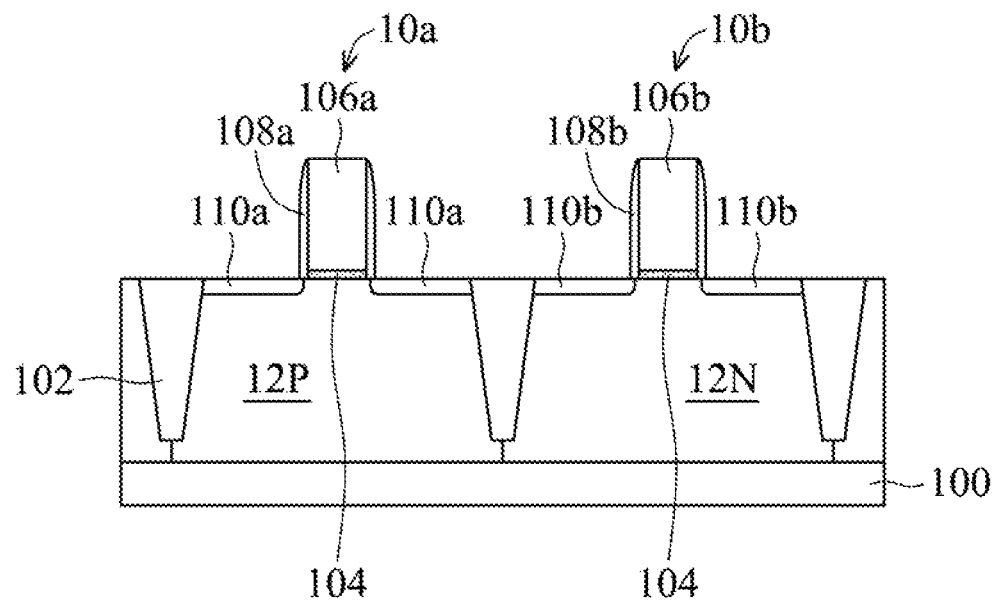
FIGS. 1A-1H are cross-sectional views of various stages of a process for forming a semiconductor device structure, in accordance with some embodiments.

FIGS. 1A-1H are cross-sectional views of various stages of a process for forming a semiconductor device structure, in accordance with some embodiments. As shown in FIG. 1A, a semiconductor substrate 100 is provided. In some embodiments, the semiconductor substrate 100 is a semiconductor wafer (such as a silicon wafer) or a portion of a semiconductor wafer. In some embodiments, the semiconductor substrate 100 includes an elementary semiconductor material including silicon or germanium in a single crystal, polycrystal, or amorphous structure. In some other embodiments, the semiconductor substrate 100 includes a compound semiconductor, such as silicon carbide, gallium arsenide, gallium phosphide, indium phosphide, indium arsenide, an alloy semiconductor, such as SiGe, GaAsP, AlInAs, AlGaAs, GaInAs, GaInP, GaInAsP, or a combination thereof. In some embodiments, the semiconductor substrate 100 includes multi-layer semiconductors, a semiconductor on insulator (SOI) (such as silicon on insulator or germanium on insulator), or a combination thereof.

In some embodiments, isolation structures 102 are formed in the semiconductor substrate 100 to define various active regions in the semiconductor substrate 100. The isolation structures 102 electrically isolate neighboring devices (e.g., transistors) from one another. The isolation structures 102 include, for example, a silicon oxide, silicon nitride, silicon oxynitride, fluoride-doped silicate glass (FSG), a low-K dielectric material, other suitable materials, or a combination thereof. The isolation structures 102 may be formed by using an isolation technology, such as local oxidation of semiconductor (LOCOS), shallow trench isolation (STI), or the like. In some embodiments, the formation of the isolation structures 102 includes patterning the semiconductor substrate 100 by a photolithography process, etching a trench in the semiconductor substrate 100 (for example, by using a dry etching, wet etching, plasma etching process, or a combination thereof), and filling the trench (for example, by using a chemical vapor deposition process) with a dielectric material. In some embodiments, the filled trench has a multi-layer structure, such as a thermal oxide liner layer filled with silicon nitride or silicon oxide.

In some embodiments, a P-well region 12P and an N-well region 12N are formed sequentially in the semiconductor substrate 100, as shown in FIG. 1A. In some embodiments, separate ion implantation processes are performed to form the P-well region 12P and the N-well region 12N, respectively. By using two different implantation mask layers, the P-well region 12P and the N-well region 12N are sequentially formed in different ion implantation processes.

In some embodiments, a first implantation mask layer (not shown) is used to cover a first portion of the semiconductor substrate 100. The first implantation mask layer has an opening which exposes another portion of the semiconductor substrate 100. In some embodiments, the first implantation mask layer is a patterned photoresist layer. In some other embodiments, the first implantation mask layer is a patterned dielectric layer, such as a silicon nitride layer. Afterwards, a first ion implantation process is performed on the exposed portion of the semiconductor substrate 100 to form a well region such as the P-well region 12P. For example, P-type dopants are implanted into the exposed portion of the semiconductor substrate 100 to form the P-well region 12P. The first implantation mask layer is then removed.

Afterwards, a second implantation mask layer (not shown) is used to cover the P-well region 12P in some embodiments. The second implantation mask layer has an opening which exposes the portion of the semiconductor substrate 100 previously covered by the first implantation mask layer. In some embodiments, the second implantation mask layer is a patterned photoresist layer. In some other embodiments, the second implantation mask layer is a patterned dielectric layer, such as a silicon nitride layer. Afterwards, a second ion implantation process is performed to form a well region such as the N-well region 12N. For example, N-type dopants are implanted into the exposed portion of the semiconductor substrate 100 to form the N-well region 12N.

Afterwards, an annealing process is performed to drive in the implanted dopants in some embodiments. In some other embodiments, the N-well region 12N is formed before the P-well region 12P. In some other embodiments, the P-well region is not formed if the semiconductor substrate 100 is a P-type semiconductor substrate. In some other embodiments, the N-well region is not formed if the semiconductor substrate 100 is an N-type semiconductor substrate.

As shown in FIG. 1A, gate stacks are formed over the semiconductor substrate 100, in accordance with some embodiments. To simplify the diagram, only two gate stacks 10a and 10b are depicted. The semiconductor device structure may include fewer or more gate stacks. Each of the gate stacks 10a and 10b includes a gate dielectric layer 104 and a gate electrode such as gate electrodes 106a and 106b shown in FIG. 1A. In some embodiments, the gate dielectric layer 104 is made of silicon oxide, silicon oxynitride, a high dielectric constant material (high-k material), or a combination thereof. The high dielectric constant material may include hafnium oxide (HfO$_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, or a combination thereof. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina (HfO$_2$—Al$_2$O$_3$) alloy, other suitable materials, or a combination thereof.

In some embodiments, the gate dielectric layer 104 is deposited by a suitable process, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, plating, other applicable processes, or a combination thereof.

Afterwards, a gate electrode layer is deposited over the gate dielectric layer 104. In some embodiments, the gate electrode layer is made of polysilicon and formed, for example, by using a CVD process or other suitable processes.

Afterwards, the gate dielectric layer 104 and the gate electrode layer are patterned, for example, by using a photolithography process and an etching process so as to form the gate stacks including the gate stacks 10a and 10b. The gate electrode layer is therefore patterned to be multiple gate electrodes including the gate electrodes 106a and 106b, as shown in FIG. 1A.

Afterwards, one or more sealing structures, such as sealing structures 108a and 108b, are formed over sidewalls of the gate stacks 10a and 10b, as shown in FIG. 1A in accordance with some embodiments. The sealing structures 108a and 108b may be used to protect the gate stacks 10a and 10b from damage when subsequent process operations are performed. In some embodiments, the sealing structures 108a and 108b are made of a dielectric material. The dielectric material includes, for example, silicon nitride, silicon oxide, silicon oxynitride, other suitable materials, or a combination thereof. In some embodiments, a sealing layer is deposited over the gate stacks 10a and 10b and the semiconductor substrate 100 by using a suitable process, such as a CVD process. Afterwards, an etching process, such as a dry etching process, is performed to partially remove the sealing layer. The sealing layer remaining on the opposite sidewalls of the gate stacks 10a and 10b form the sealing structures 108a and 108b.

Afterwards, doped regions 110a and 110b are formed in the semiconductor substrate 100, as shown in FIG. 1A in accordance with some embodiments. Separate ion implantation processes are performed to sequentially form the doped regions 110a and 110b. In some embodiments, an implantation mask layer (not shown) is used to cover the N-well region 12N. Afterwards, an implantation process is performed, also with the gate stack 10a as an implantation mask, to form the doped regions 110a. In some embodiments, N-type dopants are implanted into the P-well 12P to form the doped regions 110a. Similarly, the doped regions 110b are formed in the N-well region 12N using another implantation process. Another implantation mask layer (not shown) is also used to assist in the formation of the doped regions 110b. Therefore, P-type dopants are implanted into the N-well region 12N to form the doped regions 110b, without being implanted into the P-well region 12P.

The doped regions 110a and 110b are respectively on opposite sides of the gate stacks 10a and 10b and in the semiconductor substrate 100. In some embodiments, a portion of the doped region 110a is near the gate stack 10a and underneath the sealing structure 108a. In some embodiments, the doped region 110a serves as a lightly-doped source/drain region (LDS/D region). In some embodiments, a portion of the doped region 110b is near the gate stack 10b and underneath the sealing structure 108b. In some embodiments, the doped region 110b serves as an LDS/D region. In some embodiments, the implantation processes are performed at a tilt angle such that the formed doped regions 110a and 110b extend under the gate stacks 10a and 10b, respectively.

Figure 1B:
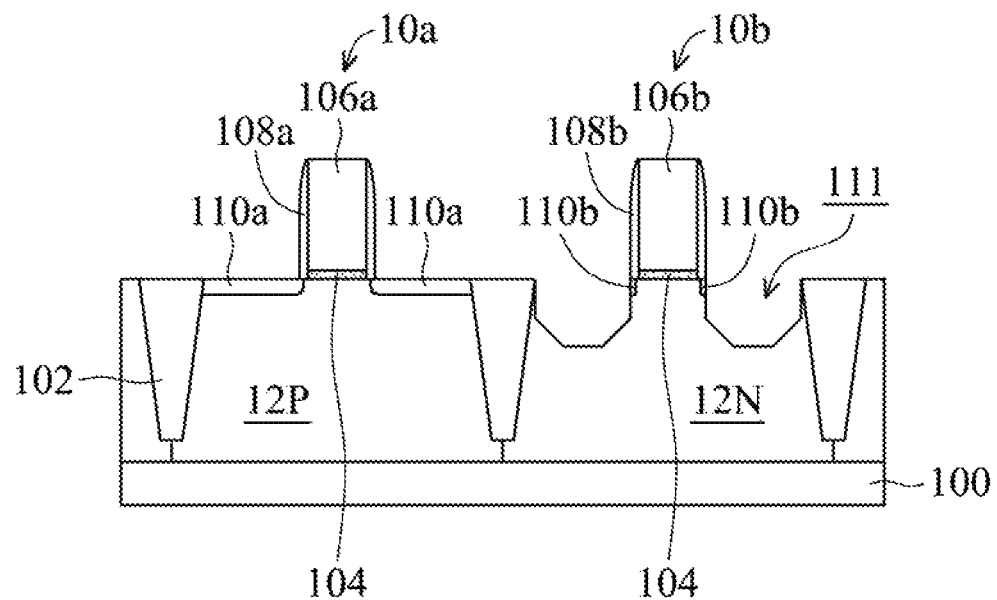

As shown in FIG. 1B, a portion of the semiconductor substrate 100 is removed to form recesses 111 in the semiconductor substrate 100, in accordance with some embodiments. As shown in FIG. 1B, the recesses 111 extend into the N-well region 12N from a surface of the semiconductor substrate 100. As shown in FIG. 1B, the doped regions 110b are partially removed. In some embodiments, the doped regions 110b are between the recesses 111. In some embodiments, a photolithography process and an etching process are performed to form the recesses 111. Embodiments of the disclosure have many variations. In some embodiments, the recesses 111 are formed before the doped regions 110b are formed.

Figure 1C:
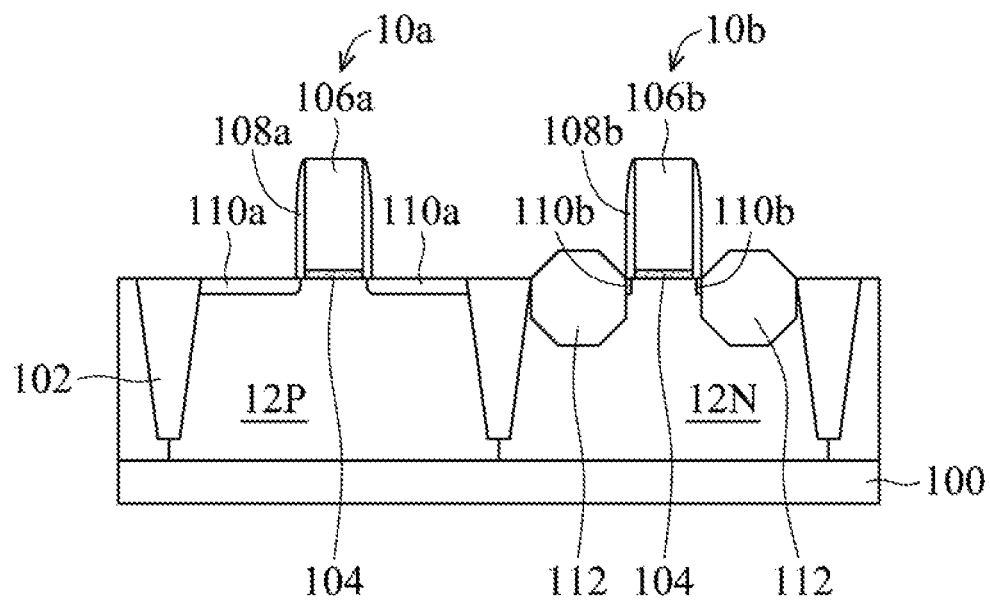

As shown in FIG. 1C, source/drain stressors 112 are epitaxially grown or formed in the recesses 111, in accordance with some embodiments. The source/drain stressors 112 include SiGe or other applicable materials, in accordance with some embodiments. In some embodiments, the source/drain stressors 112 are used to provide stress to the channel region under the gate stack 10b so as to increase the carrier mobility. In some embodiments, the source/drain stressors 112 are simultaneously doped during their growth or formation. Alternatively, a subsequent implantation process is performed to dope the source/drain stressors 112 following the growth or formation of the source/drain stressors 112. In some embodiments, however, the source/drain stressors 112 are not formed. The recesses 111 are not formed.

Figure 1D:
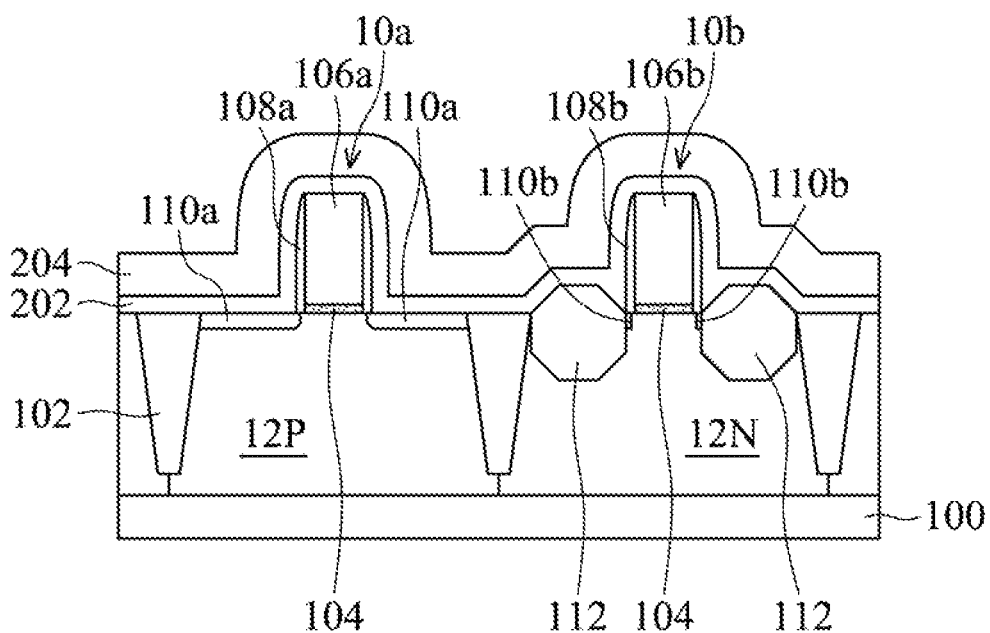

As shown in FIG. 1D, a dummy shielding layer 204 is deposited over the semiconductor substrate 100, the sealing structures 108a and 108b, and the gate stacks 10a and 10b, in accordance with some embodiments. In some embodiments, the dummy shielding layer 204 functions as a temporary main spacer for subsequent implantation processes.

In some embodiments, the dummy shielding layer 204 is made of a photoresist material. The photoresist material may include a mixture of carbon, hydrogen, and oxygen, other suitable materials, or a combination thereof. In some embodiments, the dummy shielding layer 204 includes a photosensitive polymer. The photosensitive polymer may include poly(methyl)methacylate (PMMA), acrylic resin, methacrylate resin, hybrid type resin, other suitable photosensitive polymers, or a combination thereof. In some embodiments, the dummy shielding layer 204 includes a photo acid generator such as sulfonium salt, diazomethane, or other suitable photo acid generator. In some embodiments, the dummy shielding layer 204 includes cetyltrimethyl ammonium hydroxide.

In some embodiments, the dummy shielding layer 204 is deposited using a spin-on process, CVD process, other applicable processes, or a combination thereof. The thickness of the dummy shielding layer 204 may be adjusted according to requirements. In some embodiments, the thickness of the dummy shielding layer 204 is in a range from about 5 nm to about 20 nm. In some other embodiments, the thickness of the dummy shielding layer 204 is in a range from about 7 nm to about 15 nm.

In some embodiments, an anti-reflection dielectric (ARD) layer 202 is deposited before depositing the dummy shielding layer 204. In some embodiments, the ARD layer 202 is made of silicon nitride, titanium nitride, other applicable materials, or a combination thereof. In some embodiments, the ARD layer 202 has a thickness ranging from about 10 Å to about 50 Å. However, in some other embodiments, the ARD layer 202 is not needed or formed.

Figure 1E:
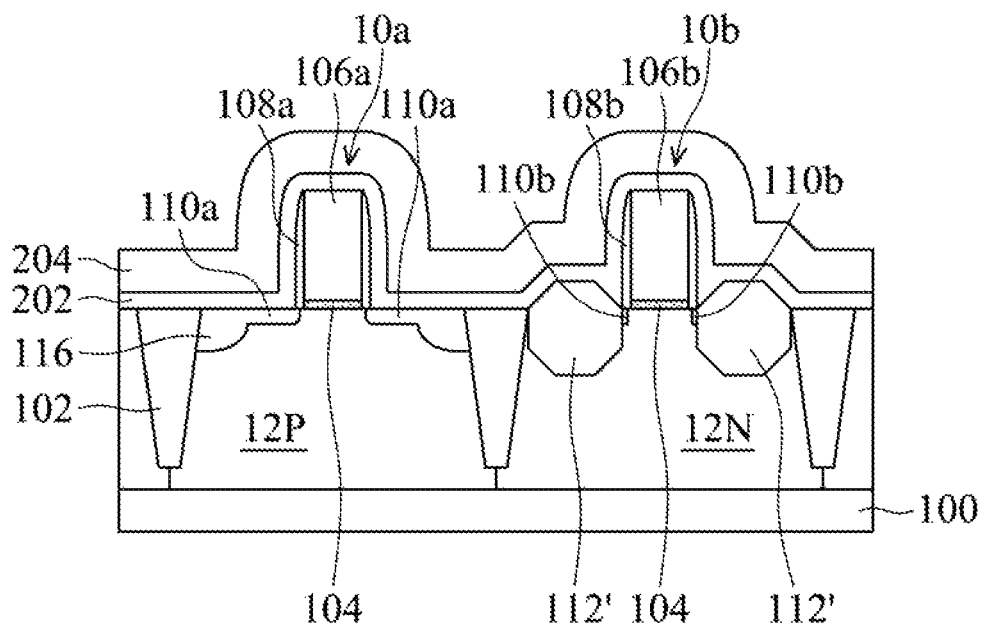

As shown in FIG. 1E, an implantation process is performed to form doped regions 116 in the semiconductor substrate 100, in accordance with some embodiments. The dummy shielding layer 204 functions as an implantation mask. Therefore, the doped regions 116 (e.g. S/D region) is formed adjacent to the doped region 110a (e.g. LDS/D region). In some embodiments, N-type dopants are implanted to form the doped regions 116. In some embodiments, an implantation mask layer (not shown) is used to ensure that the N-type dopants are not implanted into the source/drain stressors 112. After the doped regions 116 are formed, the implantation mask layer is removed. In some embodiments, the doped region 116 is a heavily-doped source/drain region (S/D region). After the implantation process is performed on the S/D region, an annealing process, such as a rapid thermal process (RTP), may be performed to repair the crystal structure of the silicon in the S/D region and activate the dopant in the S/D region. As shown in FIG. 1E, the doped region 116 is not covered by the sealing structure 108a in some embodiments.

In some embodiments, another implantation process is performed to dope the source/drain stressors 112 with suitable dopants. In some embodiments, P-type dopants are implanted into the source/drain stressors 112. As a result, source and drain regions 112' are formed on opposite sides of the gate stack 10b, as shown in FIG. 1E. The implantation process for forming the source and drain regions 112' may be performed before or after the formation of the doped regions 116. Similarly, an implantation mask layer (not shown) may be used to ensure that the dopants are implanted into suitable positions.

Figure 1F:
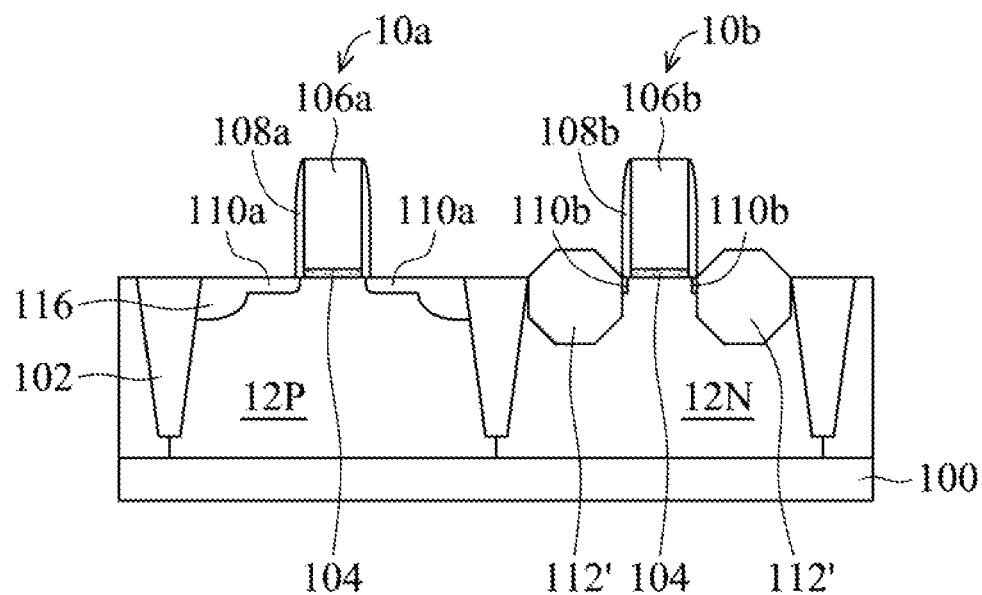

As shown in FIG. 1F, the dummy shielding layer 204 and the ARD layer 202 (if formed) are removed, in accordance with some embodiments. In some embodiments, the dummy shielding layer 204 is completely removed. In some embodiments, the dummy shielding layer 204 is made of a photoresist material. Therefore, the dummy shielding layer 204 may be easily removed by using an ashing process or stripping process. In some embodiments, the dummy shielding layer 204 acts as a temporary main spacer and is easily removed. In some embodiments, after the dummy shielding layer 204 is removed, no area is occupied by the dummy shielding layer 204 (the temporary main spacer). As a result, the contact landing area is increased. In some embodiments, it is not necessary to form a dielectric layer and carefully etch and tune the profile for forming a main spacer. Process time and cost are significantly reduced. When designing patterns of the gate stacks, it is not necessary to define areas for forming the main spacers, in accordance with some embodiments. More dense patterns may be designed. Pitches between gate stacks may be reduced.

Figure 1G:
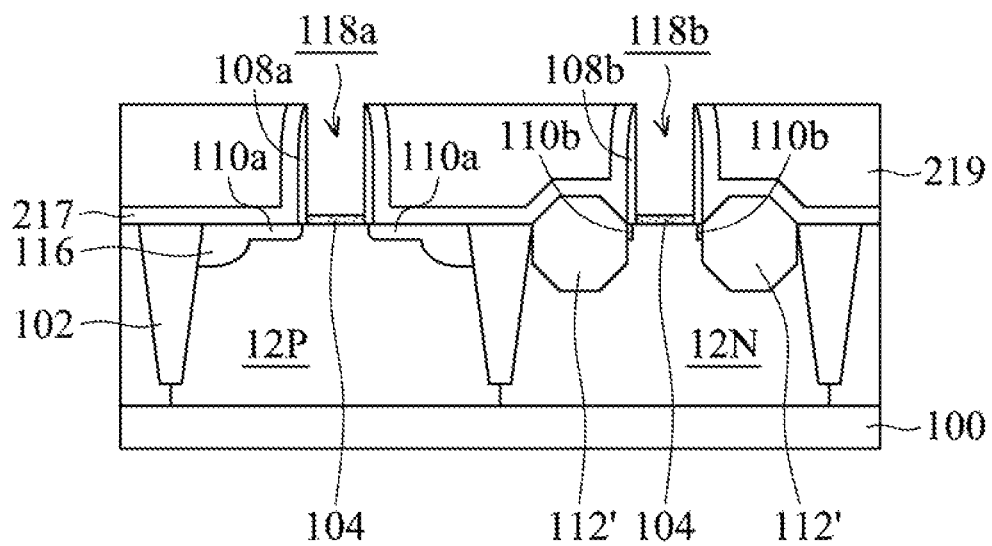

Afterwards, an etch stop layer 217 is deposited over the semiconductor substrate 100, the gate stacks 10a and 10b, and the sealing structures 108a and 108b, as shown in FIG. 1G in accordance with some embodiments. The etch stop layer 217 includes a silicon nitride layer in some embodiments. In some embodiments, the etch stop layer 217 is conformally deposited over the semiconductor substrate 100. In some embodiments, the etch stop layer 217 is formed by using a suitable process, such as a CVD process. In some embodiments, the etch stop layer 217 also serves as a stressor layer, which increases the carrier mobility in the channel regions under the gate stacks, thus improving the operation of a semiconductor device formed thereby.

As shown in FIG. 1G, the etch stop layer 217 is in direct contact with the sealing structures 108a and 108b, in accordance with some embodiments. In some embodiments, there is no main spacer or intermediate layer between the sealing structure (108a or 108b) and the etch stop layer 217. In some embodiments, the entire outer surface of the sealing structure (108a or 108b) is in direct contact with the etch stop layer 217.

Afterwards, an insulating layer 219 is deposited over the etch stop layer 217, as shown in FIG. 1G in accordance with some embodiments. In some embodiments, the insulating layer 219 is made of a suitable dielectric material. The suitable dielectric material may include silicon oxide, silicon oxynitride, borosilicate glass (BSG), phosphoric silicate glass (PSG), borophosphosilicate glass (BPSG), fluorinated silicate glass (FSG), low-k material, porous dielectric material, other applicable materials, or a combination thereof. A suitable process, such as a CVD process, HDPCVD process, spin-on process, sputtering process, or a combination thereof, is performed to form the insulating layer 219, in accordance with some embodiments.

In some embodiments, a planarization process is performed to thin down the insulating layer 219. After the planarization process, the insulating layer 219 has a substantially planar surface to facilitate subsequent process operations. The planarization process includes, for example, a chemical mechanical polishing (CMP) process. In some embodiments, one or more metal gate replacement processes is/are subsequently performed to replace the gate electrodes 106a and/or 106b with suitable metal materials. However, embodiments of the disclosure are not limited thereto. In some other embodiments, the gate electrodes 106a and 106b are not replaced. In some other embodiments, one of the gate electrodes 106a and 106b is not replaced.

After the planarization of the insulating layer 219, the gate electrodes 106a and 106b, which serve as dummy gate electrodes, are removed to form openings 118a and 118b, as shown in FIG. 1G in accordance with some embodiments. In some embodiments, an etching process is performed to remove the gate electrodes 106a and 106b simultaneously. In some other embodiments, the gate electrodes 106a and 106b are separately removed in different etching processes.

In some embodiments, the gate electrodes 106a and 106b are removed using a wet etching process. For example, an etching solution containing $NH_4OH$ solution, dilute-HF, other suitable etching solution, or a combination thereof may be used. In some embodiments, the gate electrodes 106a and 106b are removed using a dry etching process. Example etchants includes fluorine and/or chlorine based etchants.

Figure 1H:
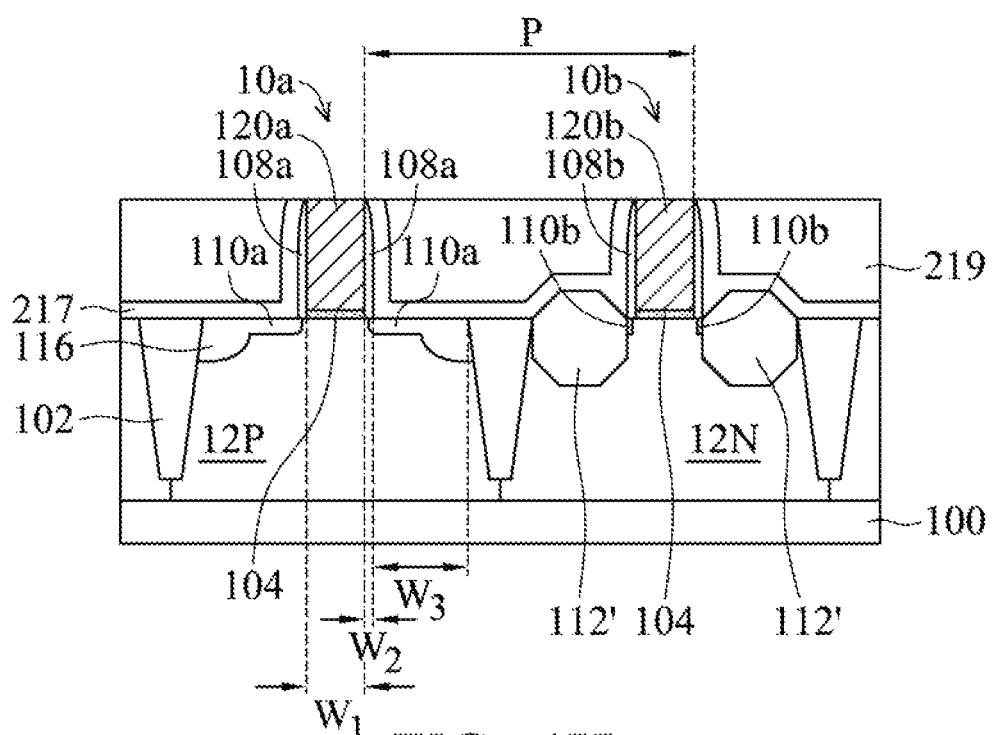

As shown in FIG. 1H, metal gate electrodes 120a and 120b are sequentially formed in the openings 118a and 118b, in accordance with some embodiments. Each of the metal gate electrodes 120a and 120b includes a work function layer(s) and a gate electrode layer in some embodiments. The gate electrode layer is used to provide electrical connection between the work function layer(s) and a subsequently formed contact coupled to the gate electrode layer. In some embodiments, the gate electrode layer is made of a suitable metal material. The suitable metal material may include aluminum, tungsten, gold, platinum, cobalt, other suitable metal materials, an alloy thereof, or a combination thereof.

The work function layer(s) provides the desired work function for transistors to enhance device performance, including improved threshold voltage. In the embodiments of forming an NMOS transistor, the work function layer(s) can be an N-type metal capable of providing a work function value suitable for the device. The work function value is, for example, equal to or less than about 4.5 eV. The n-type metal may include metal, metal carbide, metal nitride, or a combination thereof. For example, the N-type metal includes tantalum, tantalum nitride, or a combination thereof. In some embodiments, the metal gate electrode 120a includes the N-type metal.

On the other hand, in the embodiments of forming a PMOS transistor, the work function layer(s) can be a P-type metal capable of providing a work function value suitable for the device. The work function value is, for example, equal to or greater than about 4.8 eV. The P-type metal may include metal, metal carbide, metal nitride, other suitable materials, or a combination thereof. For example, the P-type metal includes titanium, titanium nitride, other suitable materials, or a combination thereof. In some embodiments, the metal gate electrode 120b includes the P-type metal.

The work function layer(s) may also be made of hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combination thereof.

In some embodiments, the metal gate electrode 120a is formed before the metal gate electrode 120b. In some embodiments, a mask layer (not shown) is formed to cover and/or fill the opening 118b to ensure the metal gate electrode 120a is formed in the opening 118a and not formed in the opening 118b. The mask layer may also be referred to as a blocking layer. In some embodiments, the mask layer is made of polysilicon, amorphous silicon, silicon nitride, silicon oxide, spin-on glass, other suitable materials, or a combination thereof.

In some embodiments, a hard mask material is deposited over the insulating layer 219 to overfill the openings 118a and 118b. Afterwards, a planarization process is performed to remove the hard mask material outside of the openings 118a and 118b. In some embodiments, a masking element (not shown) is formed to cover the hard mask material remaining in the opening 118b such that the hard mask material remaining in the opening 118a is exposed. The masking element is a patterned photoresist layer in some embodiments. Afterwards, the hard mask material in the opening 118a is removed by using a suitable etchant, in accordance with some embodiments. The masking element is then removed. As a result, the hard mask material remaining in the opening 118b forms the mask layer covering and/or filling the opening 118b in some embodiments. In some embodiments, the mask layer is used to ensure the metal gate electrode 120 is formed in the opening 118a and not formed in the opening 118b.

In some embodiments, the work function layer(s) (such as an N-type metal) is deposited over the insulating layer 219 and sidewalls and bottoms of the opening 118a by using a suitable deposition process. The suitable deposition process may include a PVD process, plating process, CVD process, other applicable processes, or a combination thereof. Afterwards, the gate electrode layer is deposited over the work function layer(s) by using, for example, a PVD process, plating process, CVD process, or the like. The gate electrode layer and the work function layer(s) are then patterned to remove the portions outside of the opening 118a. In some embodiments, a planarization process, such as a CMP process, is performed to remove the portions outside of the opening 118a. As a result, the metal gate electrode 120a is formed. Afterwards, the mask layer covering and/or filling the opening 118b is removed.

Afterwards, the metal gate electrode 120b is formed in the opening 118b, as shown in FIG. 1H in accordance with some embodiments. The work function layer(s) (such as a P-type metal) and the gate electrode layer are subsequently formed to fill the opening 118b and patterned to form the metal gate electrode 120b. It should be appreciated, however, that embodiments of the disclosure are not limited thereto. In some other embodiments, the metal gate electrode 120b is formed before the metal gate electrode 120a.

Embodiments of the disclosure have many variations. As mentioned above, the gate electrodes 106a and 106b may be separately removed in different etching processes. In some embodiments, the gate electrode 106a is removed in a first etching process, and the gate electrode 106b is covered by a mask layer (not shown) and remains. Afterwards, the metal gate electrode 120a is formed in the opening 118a. The gate electrode 106b is removed after the metal gate electrode 120a is formed. Afterwards, the metal gate electrode 120b is formed in the opening 118b.

In some other embodiments, a first replacement process is performed to replace the gate electrode 106b with the metal gate electrode 120b. Afterwards, a second replacement process is performed to replace the gate electrode 106a with the metal gate electrode 120a.

As shown in FIG. 1H, the gate stack 10a has a thickness or width $W_1$. In some embodiments, the width $W_1$ is in a range from about 10 nm to about 40 nm. As shown in FIG. 1H, the sealing structure 108a has a thickness or width $W_2$ in a range from about 5 nm to about 15 nm in some embodiments. In some other embodiments, the width $W_2$ is in a range from about 7 nm to about 10 nm. In some embodiments, the width $W_2$ is the width of the bottom portion of the sealing structure 108a.

In some embodiments, the width $W_1$ of the gate stack 10a is larger than the width $W_2$ of the sealing structure 108a. In some embodiments, a width ratio of the sealing structure 108a to the gate stack 10a ($W_2/W_1$) is in a range from about 0.05 to about 0.7. In some other embodiments, the width ratio ($W_2/W_1$) is in a range from about 0.1 to about 0.5.

As mentioned above, the dummy shielding layer 204 is used as a temporary main spacer and is removed after S/D regions are formed. The area used for contact landing is not occupied by any main spacer. As a result, the contact landing area is increased. As shown in FIG. 1H, the contact landing area is substantially equal to a width $W_3$. In some embodiments, the width $W_3$ is measured from a lower surface of the sealing structure 108a to an outer edge of the isolation structure 102. In some embodiments, the width $W_3$ is in a range from about 20 nm to about 50 nm. In some other embodiments, the width $W_3$ is in a range from about 30 nm to about 40 nm. Therefore, it is easier to form a contact above a larger contact landing area since no main spacer occupies the contact landing area. The performance and yield are improved accordingly.

As shown in FIG. 1H, the semiconductor device structure has a gate-to-gate pitch P. Since no space is occupied by a main spacer or the temporary main spacer (the dummy shielding layer 204 which have been removed), the gate-to-gate pitch P is reduced, compared with other semiconductor device structures with main spacers. In some embodiments, the gate-to-gate pitch P is in a range from about 30 nm to about 90 nm. In some other embodiments, the gate-to-gate pitch P is in a range from about 40 nm to about 70 nm.

The metal gate electrodes 120a and 120b are respectively in direct contact with the sealing structures 108a and 108b, as shown in FIG. 1H in accordance with some embodiments. For example, the sealing structures 108a and 108b are in direct contact with the work function layers of the metal gate electrodes 120a and 120b, respectively. However, in some other embodiments, there is another layer between the metal gate electrode and the sealing structure, which will be described in more detail below.

Figure 2:
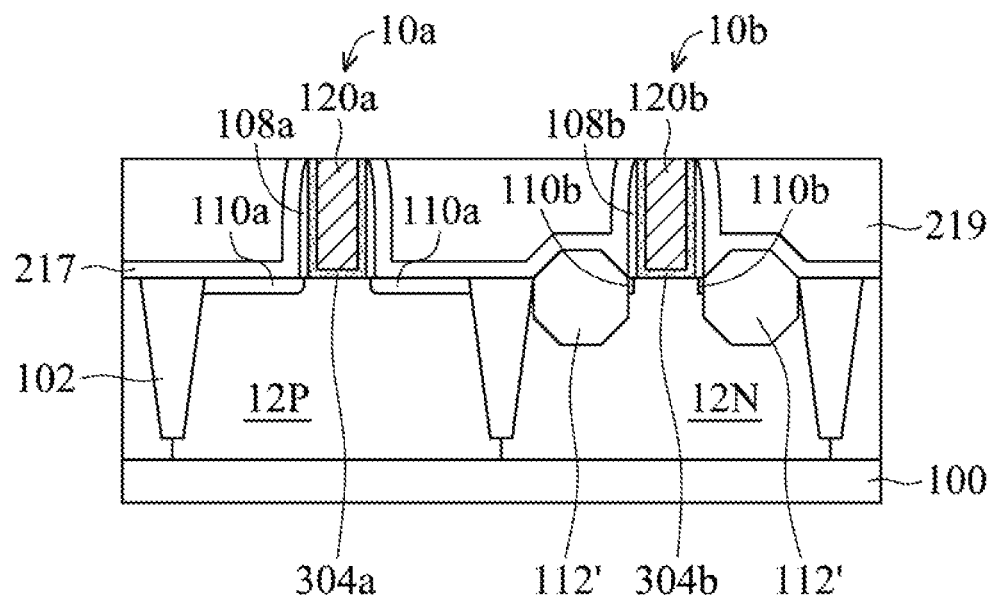
FIG. 2 is a cross-sectional view of a semiconductor device structure, in accordance with some embodiments.

FIG. 2 is a cross-sectional view of a semiconductor device structure, in accordance with some embodiments. In some embodiments, the gate dielectric layer 104 is also replaced with other gate dielectric layer(s). As shown in FIG. 2, gate dielectric layers 304a and 304b are sequentially formed over the bottoms and the sidewalls of the openings 118a and 118b to replace the gate dielectric layer 104, in accordance with some embodiments. In some other embodiments, the gate dielectric layers 304a and 304b are patterned from the same dielectric layer. In these cases, the materials of the gate dielectric layers 304a and 304b are the same. In some embodiments, after the gate dielectric layers 304a and 304b are formed, a mask layer (not shown) is formed to cover and/or fill one of the openings (118a or 118b) to assist in subsequent formation of metal gate electrodes 120a and 120b. Similar to the embodiments shown in FIG. 1H, the metal gate electrodes 120a and 120b are sequentially formed.

The gate dielectric layers 304a and 304b may include a high dielectric constant material (high-k material). The high-k material may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, or a combination thereof. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, other suitable materials, or a combination thereof.

As shown in FIG. 2, the metal gate electrode 120a or 120b is not in direct contact with the sealing structure 108a or 108b, in accordance with some embodiments. The gate dielectric layer 304a (or 304b) separates the metal gate electrode 120a (or 120b) from the sealing structure 108a (or 108b). In some embodiments, portions of the LDS/D regions (such as the doped regions 110a and 110b) are covered by the sealing structures 108a and 108b, respectively.

Figure 3:
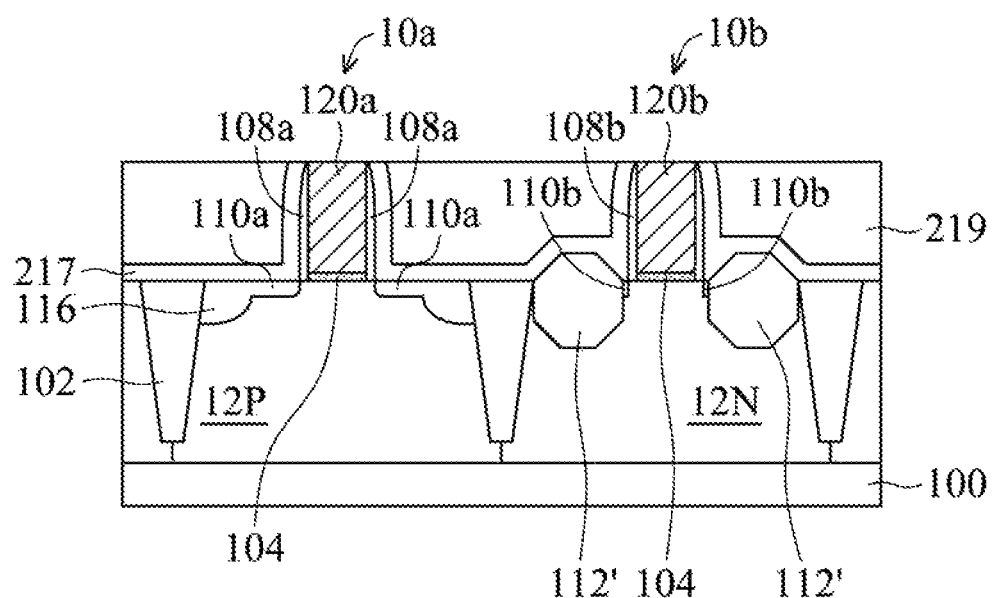
FIG. 3 is a cross-sectional view of a semiconductor device structure, in accordance with some embodiments.

Embodiments of the disclosure have many variations. For example, the LDS/D region (such as the doped regions 110a or 110b) is not limited to being covered by the sealing structure. FIG. 3 is a cross-sectional view of a semiconductor device structure, in accordance with some embodiments. As shown in FIG. 3, a terminal portion of the LDS/D region (such as the doped region 110a or 110b) and an outer surface of the sealing structure (such as the sealing structure 108a or 108b) are aligned or substantially aligned with each other, in accordance with some embodiments. In some embodiments, the LDS/D region (such as the doped region 110a or 110b) is not covered by or do not extend under the sealing structure 108a or 108b.

Embodiments for forming a semiconductor device structure are provided. A dummy shielding layer, such as a photoresist layer, is used as a temporary main spacer to assist in the implantation process for forming the source and drain regions (e.g. heavily doped source and drain regions) of the semiconductor device structure. The dummy shielding layer can be easily removed afterwards such that there is no main spacer remaining over the gate stacks of the semiconductor device structure. Therefore, the gate to gate pitch is reduced, and the contact landing area is increased. Since it is not necessary to form a dielectric layer and carefully etch and tune the profile for forming a main spacer, process time and cost are significantly reduced. The yield and the reliability of the semiconductor device structure are therefore improved.

In accordance with some embodiments, a method for forming a semiconductor device structure is provided. The method includes forming a gate stack over a semiconductor substrate and forming a sealing structure over a sidewall of the gate stack. The method also includes forming a dummy shielding layer over the semiconductor substrate, the sealing structure, and the gate stack. The method further includes performing an ion implantation process on the dummy shielding layer to form source and drain regions in the semiconductor substrate. In addition, the method includes removing the dummy shielding layer after the source and drain regions are formed.

In accordance with some embodiments, a method for forming a semiconductor device structure is provided. The method includes forming a first gate stack and a second gate stack over a semiconductor substrate and forming sealing structures over sidewalls of the first gate stack and the second gate stack, respectively. The method also includes forming a dummy shielding layer over the sealing structures. The method further includes sequentially performing ion implantation processes on the dummy shielding layer to sequentially form first source and drain regions and second source and drain regions in the semiconductor substrate and on opposite sides of the first gate stack and the second gate stack, respectively. In addition, the method includes removing the dummy shielding layer after the first source and drain regions and the second source and drain regions are formed.

In accordance with some embodiments, a semiconductor device structure is provided. The semiconductor device structure includes a semiconductor substrate and a gate stack over the semiconductor substrate. The semiconductor device structure also includes a sealing structure over a sidewall of the gate stack, and a width ratio of the sealing structure to the gate stack is in a range from about 0.05 to about 0.7. The semiconductor device structure further includes an etch stop layer over the semiconductor substrate, the gate stack, and the sealing structure. The etch stop layer is in direct contact with the sealing structure.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A semiconductor device structure, comprising:
   a semiconductor substrate;
   a gate stack over the semiconductor substrate;
   a sealing structure over a sidewall of the gate stack;
   an etch stop layer over the semiconductor substrate, the gate stack, and the sealing structure, wherein the etch stop layer is in contact with the sealing structure;
   a lightly-doped source/drain region in the semiconductor substrate and adjacent to the gate stack; and
   a heavily-doped source/drain region in the semiconductor substrate and adjacent to the light-doped source/drain region, wherein the sealing structure does not cover the heavily-doped source/drain region.

2. The semiconductor device structure as claimed in claim 1, wherein there is no intermediate layer between the sealing structure and the etch stop layer.

3. The semiconductor device structure as claimed in claim 1, wherein the sealing structure comprises silicon nitride.

4. The semiconductor device structure as claimed in claim 1, wherein the gate stack comprises a metal gate electrode and a gate dielectric layer.

5. The semiconductor device structure as claimed in claim 4, wherein the sealing structure is in contact with the metal gate electrode.

6. The semiconductor device structure as claimed in claim 4, wherein the sealing structure is in contact with the gate dielectric layer.

7. The semiconductor device structure as claimed in claim 1, wherein a terminal of the lightly-doped source/drain region is aligned with an outer surface of the sealing structure.

8. The semiconductor device structure as claimed in claim 1, wherein the etch stop layer is in direct contact with the lightly-doped source/drain region.

9. The semiconductor device structure as claimed in claim 1, wherein the sealing structure is a single layer structure.

10. A semiconductor device structure, comprising:
    a semiconductor substrate;
    a gate stack over the semiconductor substrate;
    a sealing structure over a sidewall of the gate stack, wherein a width ratio of the sealing structure to the gate stack is in a range from about 0.05 to about 0.7;
    an etch stop layer over the semiconductor substrate, the gate stack, and the sealing structure, wherein the etch stop layer is in contact with the sealing structure;
    a lightly-doped source/drain region in the semiconductor substrate and adjacent to the gate stack; and
    a heavily-doped source/drain region in the semiconductor substrate and adjacent to the light-doped source/drain region, wherein the sealing structure does not cover the heavily-doped source/drain region.

11. The semiconductor device structure as claimed in claim 10, wherein there is no intermediate layer between the sealing structure and the etch stop layer.

12. The semiconductor device structure as claimed in claim 10, wherein the gate stack comprises a metal gate electrode and a gate dielectric layer, and the sealing structure is in contact with the metal gate electrode.

13. The semiconductor device structure as claimed in claim 10, wherein the gate stack comprises a metal gate electrode and a gate dielectric layer, and the sealing structure is in contact with the gate dielectric layer.

14. The semiconductor device structure as claimed in claim 10, wherein a terminal of the lightly-doped source/drain region is aligned with an outer surface of the sealing structure.

15. The semiconductor device structure as claimed in claim 10, wherein the etch stop layer is in direct contact with the lightly-doped source/drain region.

16. The semiconductor device structure as claimed in claim 10, wherein the sealing structure is a single layer structure.

17. A semiconductor device structure, comprising:
    a semiconductor substrate;
    a gate stack over the semiconductor substrate;
    a sealing structure over a sidewall of the gate stack;
    an etch stop layer over the semiconductor substrate, the gate stack, and the sealing structure, wherein the etch stop layer is in contact with the sealing structure;

a lightly-doped source/drain region in the semiconductor substrate and adjacent to the gate stack; and a heavily-doped source/drain region in the semiconductor substrate and adjacent to the light-doped source/drain region, wherein the lightly-doped source/drain region is between the heavily-doped source/drain region and the sealing structure.

18. The semiconductor device structure as claimed in claim 17, wherein the sealing structure is a single layer structure, and the sealing structure has a width in a range from about 5 nm to about 15 nm.

19. The semiconductor device structure as claimed in claim 17, wherein a width ratio of the sealing structure to the gate stack is in a range from about 0.05 to about 0.7.

* * * * *